United States Patent [19]

Miller et al.

[11] 4,138,179

[45] Feb. 6, 1979

[54] COAXIAL JACK FOR PRINTED CIRCUIT BOARDS

[75] Inventors: Curtis H. Miller, Burnsville; Robert A. Arp, Eden Prairie, both of Minn.

[73] Assignee: Med General, Inc., Minneapolis, Minn.

[21] Appl. No.: 862,345

[22] Filed: Dec. 20, 1977

[51] Int. Cl.² .................................................. H05K 1/12

[52] U.S. Cl. .............................. 339/17 LC; 339/182 R

[58] Field of Search .............. 339/17 R, 17 C, 17 LC, 339/182 R, 183, 177 R, 177 E

[56] References Cited

U.S. PATENT DOCUMENTS

| | | | |
|---|---|---|---|
| 3,514,737 | 5/1970 | Renshaw, Jr. | 339/17 C |
| 3,743,748 | 7/1973 | Reeder | 339/17 R |
| 3,777,303 | 12/1973 | McDonough | 339/258 R |
| 3,846,743 | 11/1974 | Garver | 339/17 R |
| 3,864,007 | 2/1975 | Plyler et al. | 339/17 LC |
| 3,864,011 | 2/1975 | Huber | 339/103 M |
| 3,907,396 | 9/1975 | Huber | 339/17 F |
| 3,969,010 | 7/1976 | Nailor, et al. | 339/17 C |
| 4,037,913 | 7/1977 | Deitch et al. | 339/182 R |

*Primary Examiner*—Neil Abrams

*Attorney, Agent, or Firm*—Orrin M. Haugen; Thomas J. Nikolai

[57] ABSTRACT

A female receptacle for a male pin-type coaxial jack of the type having first and second cylindrical conductive segments coaxially aligned and having ends thereof separated by an insulating segment and having an annular detent notch formed in the endmost conductive segment. The receptacle comprises a conductive sleeve having a generally U-shaped cross-section, the sleeve being of a predetermined length. The sleeve is adapted to be mounted on a printed circuit board which has a pattern of electrical conductors thereon and an aperture formed therethrough inwardly of one side edge of the printed circuit board. The conductive sleeve is connected to the printed circuit board by means of projections which extend through holes drilled in the board and when so mounted, has a first open end proximate the side edge of the board and its opposite open end proximate the edge of the aperture. The receptacle further includes a leaf-type spring having first, second and third integrally formed segments which is adapted to be attached to the side of the board opposite to the one on which the cylindrical sleeve is mounted.

4 Claims, 5 Drawing Figures

COAXIAL JACK FOR PRINTED CIRCUIT BOARDS

BACKGROUND OF THE INVENTION

1. Field of the Invention

This invention relates generally to electrical connectors, and more specifically to the design of a female receptacle adapted to cooperate with a coaxial-type jack pin and which is especially suited for use with printed circuit boards.

2. Description of the Prior Art

Coaxial jack-type connectors have long been used in the electrical industry as a means for establishing electrical connections between cooperating systems. Early telephone switchboards commonly used coaxial jacks on the ends of patch cords and which were adapted to cooperate with female receptacles on a switchboard. In these systems, however, the female receptacle was generally screw mounted on a panel and discrete wiring was used to connect the female receptacle to its associated electrical circuits.

In the past three decades, great strides have been made in the miniaturization of electronic and electrical assemblies. This is attributed to the advent of printed circuit board technology and the wide spread application of semiconductor devices including discrete transistor components and integrated circuits. It is still common practice to utilize plug-in type connectors in a wide variety of electrical and electronic gear. For example, television and high fidelity sound equipment often includes ear phone jacks, but little progress has been made since the early days of the telephone switchboard. More specifically, the female receptacle used to accept the male pin of a coaxial jack is a separate, cabinet mounted device which is electrically connected to the internal circuitry, which may be on printed circuit boards, by means of discrete wiring rather than printed conductors. Thus, a real need exists for a female plug-in jack receptacle which may be mounted directly on a printed circuit board with the electrical connections therefore being preprinted on a insulating substrate.

SUMMARY OF THE INVENTION

It is accordingly a principal object of the present invention to provide an improved female terminal which may be permanently mounted on a printed circuit panel and used to establish an electrical connection between circuit elements mounted on the printed circuit board and the outside world by way of a plug-in coaxial jack connector.

In accordance with the teachings of the present invention, a printed circuit board is provided which has a pattern of electrical wiring preprinted on one or both major surfaces thereof and which is provided with at least one aperture which is located inwardly a predetermined distance from one side edge thereof. The solid portion of the printed circuit board existing between the aperture and the side edge is the location on which the female receptacle of the present invention is adapted to be mounted. The receptacle itself comprises first and second discrete parts. More specifically, the first part comprises a generally U-shape sleeve having a curved base portion and first and second generally parallel legs extending therefrom. The length of the sleeve is approximately equal to the predetermined distance between the side edge of the printed circuit board and the aperture which is formed inwardly thereof. Along the length of the legs, each is provided with a projection which is adapted to be inserted through a plated-through hole formed in the printed circuit board such that electrical continuity can be established between the conductive sleeve and other circuit elements which may be mounted on the board. The spacing between the parallel legs of the sleeve is approximately the same as the outside diameter of the cylindrical pin comprising the male jack. Thus, a friction fit obtains when the pin is inserted into the sleeve.

The second part of the receptacle of the present invention comprises a leaf-type spring element which has three integrally formed portions. The first portion is an elongated strip having first and second projections on opposed sides and proximate to one end thereof. These projections are also adapted to fit into plated-through holes formed in the printed circuit board so as to fixedly secure the one end of the leaf-type spring to the board and to permit electrical connections thereto. The first portion of this leaf-type spring is adapted to abut the opposed major surface of the printed circuit board from the one on which the U-shape sleeve is mounted. Its length is generally equal to the predetermined distance between the side edge of the board and the aperture which is formed in it. The second segment of the leaf-type spring is bent at an oblique angle to the first segment so as to pass through the aperture formed in the bore. The third portion is also bent obliquely with respect to the second segment so as to project toward the surface of the printed circuit board but its length is such that it falls short of reaching the board. The location of the fold between the second and third segments of the leaf-type spring is forward of the open end of the conductive sleeve and approximately midway between the surface of the board on which the sleeve is mounted and the curved upper surface of the sleeve.

When the male jack pin is inserted into the sleeve and pushed through it, the junction between the second and third portions of the leaf-type spring engage an annular notch formed in the end of the pin and act as a detent. Because of the manner in which the leaf-type spring is mounted on the printed circuit board, the insertion of the male pin into the receptacle causes the spring to flex. Because the leaf spring has a relatively long unsupported segment, this flexure will not result in metal fatigue upon repeated inserts and withdrawals of the jack pin into its receptacle. The invention also offers the additional advantage of being relatively low in cost when compared to conventional prior art female receptacles used with male pin-type jack connectors. The parts are easily fabricated as by stamping and rolling and may be easily secured to the printed circuit board, either manually or automatically, with conventional component inserting devices.

The present invention further resides in various novel constructions and arrangement of parts, and further objects, novel characteristics and advantages of the present invention will be apparent to those skilled in the art to which it relates and from the following detailed description of the illustrated embodiment thereof made with reference to the accompanying drawings forming a part of this specification and in which similar reference numerals or characters are employed to designate corresponding parts throughout the several views, and in which:

DESCRIPTION OF THE PREFERRED EMBODIMENT

Figure 1:
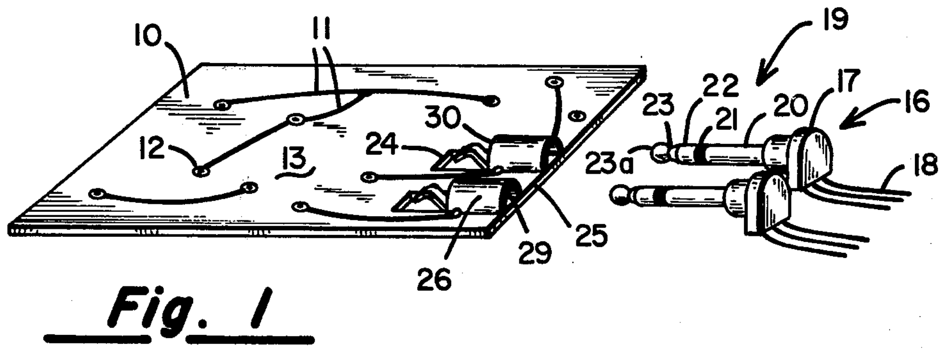
FIG. 1 is a perspective view showing a printed circuit board having the female receptacle of the preferred embodiment utilized therewith.

Referring first to FIG. 1, there is shown a insulating substrate 10 on which a predetermined pattern of electrical conductors 11 are formed. Included in the pattern 11 are one or more so-called plated-through holes 12.

Figure 2:
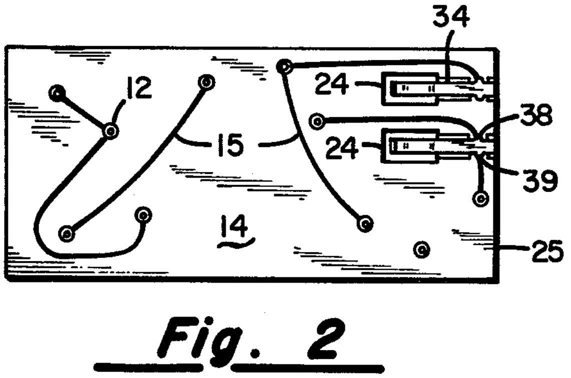
FIG. 2 is a bottom plan view of the board of FIG. 1.

With reference to FIGS. 1 and 2, the printed circuit board 10 has an upper surface 13 and a lower surface 14. The lower surface may also have a pattern of electrical conductors printed thereon as indicated by numeral 15. Continuity between portions of the patterns 11 and 15 may be accomplished by way of the plated-through holes 12. The methods for fabricating the printed wiring and plated-through holes are well known in the printed circuit art and need not be described herein.

Again with reference to FIG. 1, there is generally identified by numeral 16 the male coaxial jack-type pin member which comprises a molded plastic end portion 17 having a pair of insulated conductors 18 entering therein. Extending outwardly from the front surface of the housing 17 is a pin member indicated generally by numeral 19 and which is comprised of a first cylindrical tubular member 20, a cylindrical insulating spacer member 21 and an end tip 22 which is also conductive and generally cylindrical, but which is provided with an annular notch 23 and a ball-shaped tip 23*a*. One of the conductors 18 passes through the tubular portion 20 and is insulated therefrom and electrically connects to the top portion 22. The other conductor in the cable 18 is electrically connected to the conductive cylinder 20.

Figure 4:
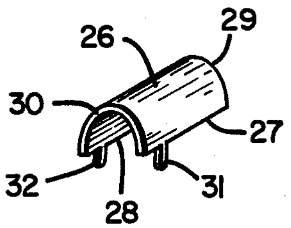
FIG. 4 is a perspective view of the conductive sleeve portion of the preferred embodiment.

Again, with reference to both FIGS. 1 and 2, it can be seen that there is formed in the insulating substrate 10 a generally rectangular aperture 24, there being one such aperture for each female receptacle to be used on the printed circuit board. The aperture 24 is disposed inwardly from the side edge 25 of the printed circuit board by a predetermined distance which generally corresponds to the length of the tubular segment 20 of the male connector pin. Affixed to the printed circuit board 10 between the side edge 25 of the board and the outermost edge of the rectangular aperture 24 is a conductive sleeve member 26, the configuration of which may be best observed with reference to FIG. 4. The conductive sleeve 26 is generally U-shaped having a curved base portion integrally formed with opposed, spaced apart, parallel leg portions 27 and 28. The U-shaped sleeve member 26 has a first open end 29 which is generally aligned with the side edge 25 of the printed circuit board and a second opened end 30 which is aligned with one edge of the rectangular aperture 24. Located proximate to the open end 30 and projecting from the legs 27 and 28 are first and second integrally formed stake segments 31 and 32. These stake elements are adapted to be inserted through mating holes provided in the printed circuit board and solder may be used to electrically connect the sleeve 26 to the printed circuit pattern 11. The spacing between the parallel legs 27 and 28 of the sleeve 26 is approximately the same as the outer diameter of the cylindrical conductive segment 20 of the jack pin 19. As such, when the pin is inserted into the open end 29 of the sleeve 26 and through the sleeve 26, a friction fit exists and electrical continuity is established.

Figure 5:
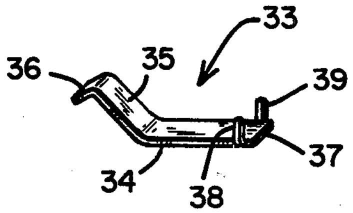
FIG. 5 is a perspective view of the leaf-type spring portion of the preferred embodiment.

Comprising the second portion of the female receptacle of the preferred embodiment is a leaf spring member which is indicated generally by numeral 33 in the perspective view of FIG. 5. It includes a first segment 34 having a length approximately equal to the length of the housing 26 and extending out of the plane of the segment 34 at an oblique angle is an integrally formed second segment 35 which is of a sufficient length to pass through the aperture 24 for a sufficient distance to assume a blocking relationship with respect to the path of travel of the pin 19 through the sleeve 26. The second segment 35 terminates in an integrally formed end portion 36 which is bent at an oblique angle with respect to the segment 35 toward the plane of the segment 34. The leaf spring member 33 may be fabricated from copper-beryllium alloy or some other suitable material having good spring-type characteristics. Formed on opposing edge surfaces of the segment 34 and proximate to its end edge 37 are first and second tooth-like projections 38 and 39 which extend at right angles to the plane of the segment 34. As is shown in FIG. 2, these projections 38 and 39 are adapted to fit into holes formed in the substrate 10 so as to mechanically connect the leaf spring member 33 to the undersurface 14 of the printed circuit board with the segments 35 and 36 thereof extending upwardly through the rectangular apertures 24. The area surrounding the holes through which the projections 38 and 39 pass may be part of the printed circuit pattern and electrical connections to the leaf spring segment 34 may be established by soldering.

Figure 3:
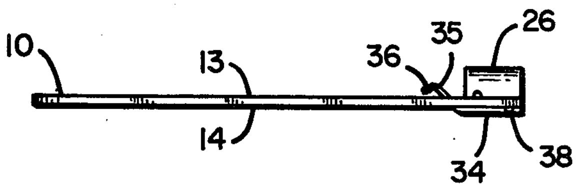
FIG. 3 is a side elevation illustrating the cooperation between the mating parts of the female receptacle of the preferred embodiment.

As can perhaps best be seen from the side view of FIG. 3, when the male pin member 19 is inserted through the sleeve, the annular notch 23 formed in the tip portion 22 of the pin will engage the fold-line between the spring segments 35 and 36 and will act as a detent. The insertion of the pin member 19 will also cause the spring member 33 to flex downward (when observed in FIG. 3) about its points of attachment 38 and 39 to the printed circuit board. In fact, this is an important feature of the present invention. Because the segment 34 of the leaf spring member 33 abuts the underside of the printed circuit board 10, there is a relatively long, unsupported segment 34 of the leaf spring, which would not be the case if the leaf spring were mounted on the same side of the printed circuit board 10 as is the cylindrical sleeve 26. Hence, the deformation of the leaf spring by insertion and removal of the male pin member will not cause excessive metal fatigue and resultant fracture after repeated use.

Because the female receptacle including the sleeve 26 and the leaf spring 33 are located proximate an outside edge of the printed circuit board 10, it is possible to mount the printed circuit board within an enclosure with the open ends 29 of the receptacles abutting the side wall of the enclosure. By providing a hole through the enclosure in alignment with the sleeve 26, an electrical connection can readily be established between an outside device having a male jack pin and the electrical circuits contained on the printed circuit board within the enclosure.

Although the illustrated embodiment hereof has been described in great detail, it should be apparent that certain modifications, changes, and adaptations may be made in the illustrated embodiment, and that it is intended to cover all such modifications, changes and adaptations which come within the spirit of the present invention.

What is claimed is:

1. In combination with a printed circuit board having a pattern of printed conductors on at least one surface and at least one aperture located inwardly a predetermined distance from one side edge thereof, a female terminal for cooperating with a male coaxial jack-type connector of the type including first and second coaxially aligned conductive cylindrical elements separated by a cylindrical insulating element and an annular notch formed in said second conductive cylindrical element, comprising:

a. a sleeve of conductive material having a generally U-shaped cross-section, the spacing between the legs of said U-shaped sleeve being equal to the diameter of said first cylindrical element and a length approximately equal to said predetermined distance, affixed to said printed circuit board on a first side thereof with a first open end of said sleeve generally aligned with said one side edge of said printed circuit board and the other open end of said sleeve generally aligned with an edge of said aperture; and b. a leaf-type spring having first, second and third integrally formed segments, said first segment being approximately equal in length to said predetermined distance and affixed to said printed circuit board on the side thereof which is opposite to said first side and at a point proximate said one side edge, said second segment being bent at an oblique angle to said first segment to pass through said aperture and extend in front of said other open end of said sleeve, and said third segment being bent at an oblique angle with respect to said second segment and extending toward, but short of said first side of said printed circuit board.

2. The terminal as in claim 1 wherein said conductive sleeve is electrically connected to a first portion of said printed circuit pattern and said leaf spring member is electrically connected to a second portion of said printed circuit pattern and electrically insulated from said conductive sleeve.

3. The terminal as in claim 2 wherein the junction between said second and third segments of said leaf-type spring is adapted to engage said annular notch formed in said second cylindrical conductive element of said male coaxial jack-type connector when said male connector is inserted through said sleeve.

4. The terminal as in claim 1 wherein said U-shaped conductive sleeve further includes first and second integrally formed projections extending from each leg of said sleeve and adapted to be inserted through holes formed in said printed circuit board at points proximate said edge of said aperture and wherein said first segment of said leaf-type spring includes first and second integrally formed projections at points proximate the end thereof opposite to the junction between said first and second segments and adapted to be inserted through holes formed in said printed circuit board proximate said one side edge thereof.

* * * * *